United States Patent [19]

Tokui et al.

[11] Patent Number: 4,956,310

[45] Date of Patent: Sep. 11, 1990

[54] SEMICONDUCTOR MEMORY DEVICE AND FABRICATING METHOD THEREOF

[75] Inventors: Akira Tokui; Shinichi Sato; Akira Kawai; Masayuki Nakajima; Hiroji Ozaki; Masao Nagatomo, all of Hyogo, Japan

[73] Assignee: Mitsubishi Denki Kabushiki Kaisha, Tokyo, Japan

[21] Appl. No.: 195,672

[22] Filed: Oct. 5, 1988

Related U.S. Application Data

[62] Division of Ser. No. 931,584, Nov. 14, 1986, abandoned.

[30] Foreign Application Priority Data

Dec. 16, 1985 [JP] Japan ................................ 60-284628

[51] Int. Cl.⁵ .................... H01L 21/32; H01L 21/426
[52] U.S. Cl. ........................................ 437/52; 437/47; 437/60; 437/228; 437/229; 437/919
[58] Field of Search .............. 437/47, 52, 60, 225, 437/228, 231, 229, 919; 357/23.6; 430/311, 312, 329

[56] References Cited

U.S. PATENT DOCUMENTS 4,350,536 9/1982 Nakano et al. .................... 437/47
4,507,159 3/1985 Erb ................................ 437/919

OTHER PUBLICATIONS

Wolf and Tauber, "Silicon Processing for The USLI Era", Lattice Press, Sunset Beach, Calif., 9-1-86, pp. 446-458.

Primary Examiner—Brian E. Hearn
Assistant Examiner—T. Thomas
Attorney, Agent, or Firm—Lowe, Price, LeBlanc, Becker & Shur

[57] ABSTRACT

A semiconductor memory device in accordance with the present invention comprises: a semiconductor substrate (1) of a first conductivity type; a charge storage region (6) and a bit line region (7) of a second conductivity type formed on a main surface of the substrate; highly doped regions (12a, 12b) of the first conductivity type formed respectively contiguous to only the bottom boundaries of the charge storage region (6) and the bit line region (7).

4 Claims, 3 Drawing Sheets

SEMICONDUCTOR MEMORY DEVICE AND FABRICATING METHOD THEREOF

This is a division, of application Ser. No. 931,584, now abandoned.

BACKGROUND OF THE INVENTION

1. Field of the Invention

The present invention relates to a semiconductor memory device in which a stored electric charge is detected as memory information, and more particularly to a memory device in which a soft error due to radioactive rays can be prevented.

2. Description of the Prior Art

Referring to FIG. 1, there is schematically illustrated a conventional dynamic RAM cell in a fragmentary sectional view. A cell area on a semiconductor substrate 1 of a P− conductivity type is surrounded by an insulator layer 8 and a P+ layer 9 for field isolation. A charge storage region 6 of an N+ type and a bit line region 7 of an N+ type are formed in the cell area. A first gate electrode layer 2 and a second gate electrode layer 3 are formed on a gate insulator layer 4 which is formed on the substrate 1. An insulator layer 5 is interposed for layer insulation between the first and second gate electrode layers 2 and 3.

The first gate electrode 2 is connected to a power source terminal T1, while the second gate electrode 3 is connected to a terminal which leads to a word line. A depletion layer 10 is formed along the boundary of the N+ storage region 6 in the P− substrate 1, while a depletion layer 11 is formed along the boundary of the N+ bit line 7. For clarity, wires and a protective film are omitted in FIG. 1 and the storage region 6 is shown as a doped N+ layer. As a matter of fact, however, an electric charge is usually accumulated in an N+ inversion layer which corresponds to the storage region 6 and is induced by applying a positive potential to the first gate electrode 2.

In a conventional cell as shown in FIG. 1, the N+ bit line 7 is normally maintained at a certain intermediate potential by a sense amplifier (not shown). When a potential is applied to the first gage electrode 3 which acts as a transfer gate, the N+ bit line 7 communicates with the N+ storage 6 and then the potential of the bit line 7 is changed depending on a charge accumulated in the storage 6. The potential change of the bit line 7 is sensed and amplified by the sense amplifier, and then the memory cell is refreshed in the same cycle by writing the same memory information.

Since the bit line 7 is formed as an N+ region or an N+ inversion region in a conventional memory device, there exists a problem that electrons generated by irradiation of radioactive rays such as α-rays are collected into the bit line 7 and then cause erroneous operation in the memory device. Further, in case that a P+ region is formed along the entire interface between the N+ bit line 7 and the P− substrate 1 in order to avoid the above problem, a portion of the P+ region extended into the channel region makes it difficult to stably operate the memory transistor.

Incidentally, a RAM cell with an increased charge storage capacitance is described by V. L. Rideout in IBM Technical Disclosure Bulletin, Vol. 21, No. 9, 1979, pp. 3823–3825.

SUMMARY OF THE INVENTION

In view of the prior art, it is a major object of the present invention to provide a semiconductor memory device which can avoid a soft error caused by radioactive rays such as α-rays with its special but simple structure without increasing the cell area and also without deteriorating characteristics of the memory transistor.

A semiconductor memory device in accordance with the present invention comprises: a semiconductor substrate of a first conductivity type; a charge storage region and a bit line region of a second conductivity type formed on a main surface of the substrate; highly doped regions of the first conductivity type formed respectively contiguous to only the bottom boundaries of the charge storage region and the bit line region.

A method for fabricating a semiconductor memory device in accordance with the present invention comprises the steps of: preparing a semiconductor substrate of a first conductivity type; forming a resist layer on the substrate and developing it to form a first resist pattern; forming highly doped regions of the first conductivity type with the first resist pattern; developing again the first resist pattern to form a second resist pattern; forming a charge storage region and a bit line region of a second conductivity type with the second resist pattern, the charge storage region and the bit line region being formed wider and shallower than the highly doped regions respectively.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
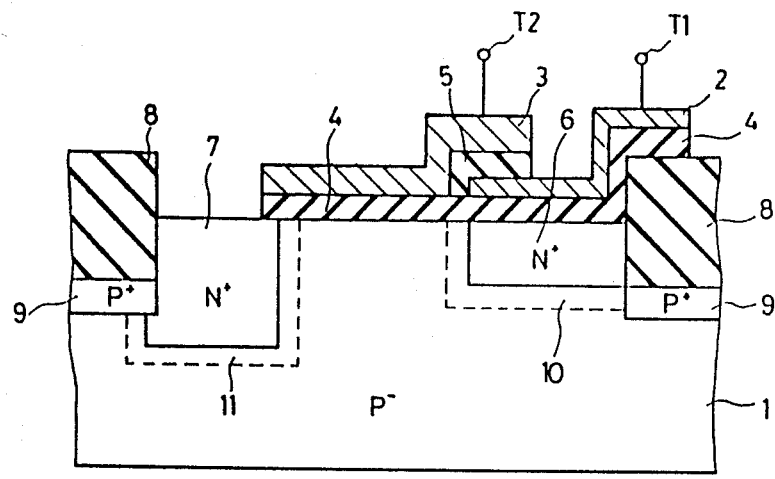
FIG. 1 is a schematic sectional view of a conventional dynamic RAM cell.
Figure 2A:
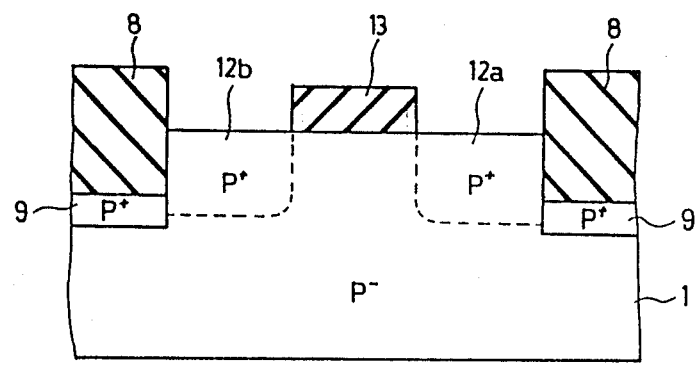
FIGS. 2A to 2C are sectional views illustrating a method for fabricating a dynamic RAM cell in accordance with the present invention.
Figure 2B:
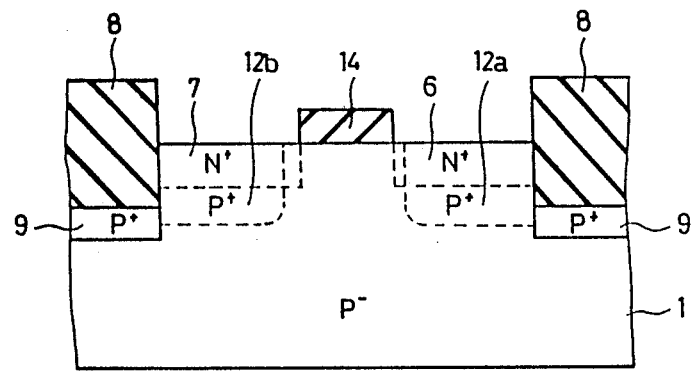
Figure 2C:
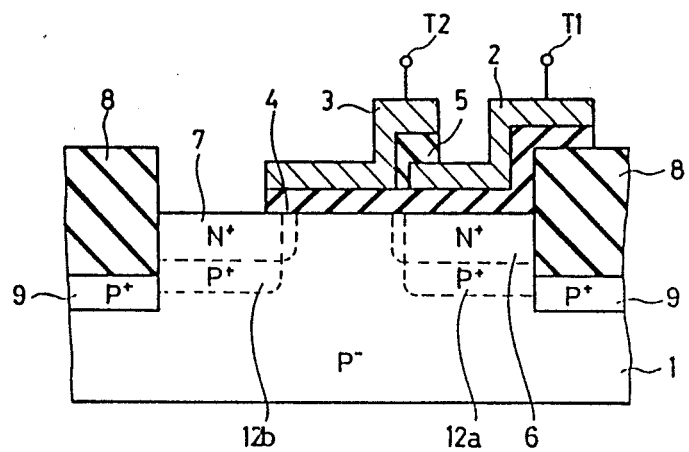

In FIGS. 2A to 2C, there is illustrated a method for fabricating a dynamic RAM cell according to an embodiment of the present invention. It is noted that the same reference numerals are used in these figures as in FIG. 1 for corresponding portions.

Referring to FIG. 2A, an insulator layer 8 and a P+ layer 9 are formed for field isolation on a P− semiconductor substrate 1 in a well-known manner, and then a first resist pattern 13 is formed by photolithography. Thereafter, highly doped P+ regions 12a and 12b are formed relatively deeper into the substrate 1 by ion implantation or diffusion. The P+ regions 12a and 12b are doped to a dopant concentration higher than that of the substrate 1.

Referring to FIG. 2B, the first resist pattern 13 is developed again to form a second resist pattern 14. Then, an N+ charge storage region 6 and an N+ bit line region 7 are formed relatively shallower with the second resist pattern 14 by ion implantation or diffusion. As a result, the N+ storage region 6 and the N+ bit line 7 are formed wider and shallower than the highly doped P+ regions 12a and 12b, respectively. In other words, the highly doped P+ regions 12a and 12b are contiguous to only the bottom boundaries of the N+ storage region 6 and the N+ bit line 7, respectively.

Referring to FIG. 2C, a gate insulator layer 4 is formed on the substrate 1 in a well-known manner. Then, a first gate electrode 2 and a second gate electrode 3 are formed with an insulator layer 5 therebetween in a conventional fashion.

The highly doped P+ regions 12a and 12b may have a dopant concentration not lower than ten times of that in the P− substrate 1. More specifically, the P− substrate may have a concentration in the range of $10^{13}$–$10^{16}$/cm$^3$, while the highly doped regions 12a and 12b may have a concentration in the range of $10^{14}$–$10^{18}$cm$^3$. Incidentally, a material having a smaller dielectric constant (e.g., PSG) may be used for a passivation film which is formed at a later stage.

With the structure of the above embodied RAM cell, the following three advantages are brought.

(1) The capacitances of the N+ storage region 6 and N+ bit line 7 are increased, since the thicknesses of depletion layer regions formed respectively at the interfaces between the N+ storage region 6 and the highly doped P+ region 12a and between the bit line 7 and the other highly doped region 12b becomes small.

(2) Electrons diffused from the P− substrate 1 do not reach the bit line 7 and storage region 6, since those electrons recombine with positive holes in the highly doped P+ regions 12a and 12b.

(3) Electrons having relatively lower energies, which are diffused from the P− substrate 1, are obstructed by the highly doped P+ regions 12a and 12b , since potential barriers are formed at the interfaces between the P− substrate and the highly doped P+ regions.

With the above advantages of (1), (2) and (3), a soft error due to electrons diffused from the substrate can be prevented effectively. Further, since any highly doped regions are not formed in the channel region of the RAM cell as shown in FIG. 2C, stable operation of the transistor can be obtained.

Although a dynamic RAM cell of an N channel type has been described in the above embodiment, it will be apparent that the present invention is applicable to a dynamic RAM cell of a P channel type. Further, it will be understood that the present invention is also applicable to a static RAM cell, a MOS device and a bipolar device.

Figure 3:
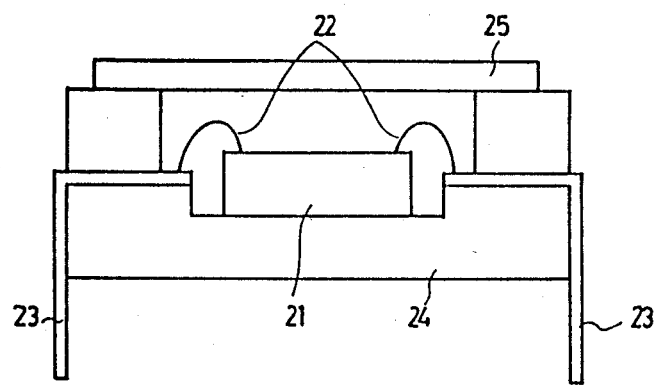
FIGS. 3 to 5 are sectional views showing semiconductor memory devices of the present invention which are packaged in different manners.
Figure 4:
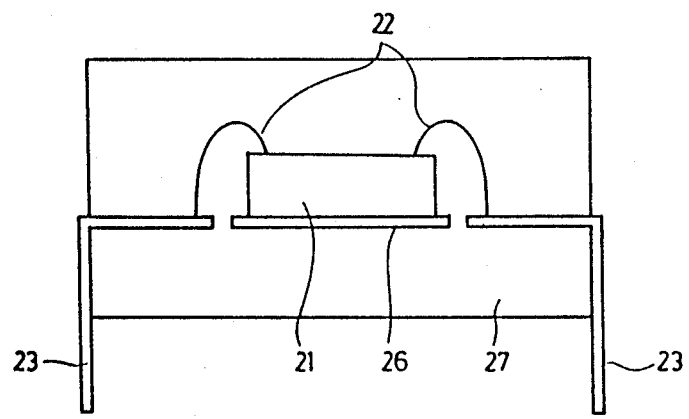
Figure 5:
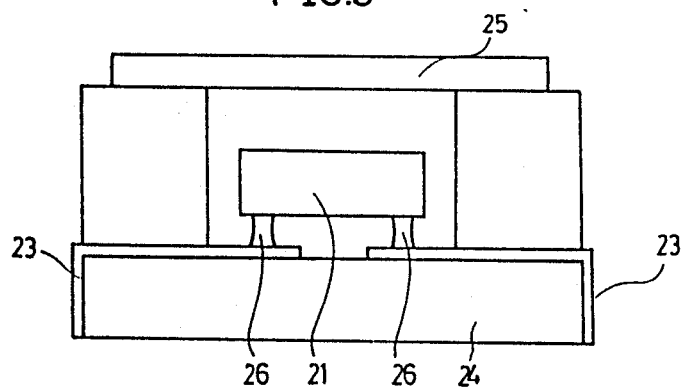

A semiconductor memory device in accordance with the present invention may be packaged in various manners. FIG. 3 shows a sectional view of a memory device housed in a ceramic package. FIG. 4 shows a device housed in a resin mold package. FIG. 5 shows a device housed as a flip chip. In FIGS. 3 to 5, a reference number 21 denotes a memory chip; 22 denotes a bonding wire; 23 denotes an external lead; 24 denotes a ceramic base; 25 denotes a lid; 26 denotes a frame; and 27 denotes a resin. Although not shown in the drawings, a semiconductor device in accordance with the present invention may also be housed in a package of a SOJ type, a ZIP type or a module type.

Materials used for those packages need not be the special ones which have a lower emissivity of α-particles and thus ordinary known cheaper materials may be used. Further, a protective film against α-particles is not required on the surface of the semiconductor device chip. In other words, a semiconductor device in accordance with the present invention can be packaged with less process steps and less cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a semiconductor memory device, comprising
   preparing a semiconductor substrate of a first conductivity type;
   forming a resist layer on said substrate and developing said layer to form a first resist pattern;
   forming highly doped regions of the first conductivity type with said first resist pattern;
   developing again said first resist pattern to form a second resist pattern; and
   forming a charge storage region and a bit line region of a second conductivity type with said second resist pattern, said charge storage region and said bit line region being formed wider and shallower than said highly doped regions respectively.

2. The method of claim 1, wherein
   said highly doped regions are doped to a dopant concentration not lower than ten times the dopant concentration in the substrate.

3. The method of claim 2, wherein
   said substrate is doped to a dopant concentration of about $10^{13}$–$10^{16}$/cm$^3$; and
   said highly doped regions are doped to a dopant concentration of about $10^{14}$–$10^{18}$/cm.

4. The method of claim 1, further comprising
   forming a first gate insulating layer on the semiconductor substrate; and
   forming first and second gate electrodes on said gate insulating layer and a second gate insulating layer between said first and second gate electrodes.

* * * * *